United States Patent

Han

[11] Patent Number: 5,926,426
[45] Date of Patent: Jul. 20, 1999

[54] SEMICONDUCTOR MEMORY DEVICE WITH SINGLE-CYCLE INTERNAL READ/WRITE FUNCTION

[75] Inventor: Kyu-Han Han, Seoul, Rep. of Korea

[73] Assignee: Samsung Electronics, Co., Ltd., Suwon, Rep. of Korea

[21] Appl. No.: 08/865,385

[22] Filed: May 29, 1997

[30] Foreign Application Priority Data

Aug. 8, 1996 [KR] Rep. of Korea ............... 96/33083

[51] Int. Cl.$^6$ ............................................. G11C 7/00
[52] U.S. Cl. ............... 365/205; 365/189.05; 365/230.08
[58] Field of Search ............................ 365/205, 189.05, 365/230.08

[56] References Cited

U.S. PATENT DOCUMENTS 5,600,601  2/1997  Murakami et al. ............. 365/203
5,680,365  10/1997 Blankenship ............. 365/230.05

*Primary Examiner*—David Nelms
*Assistant Examiner*—Hoai V. Ho
*Attorney, Agent, or Firm*—Marger Johnson, & McCollom P.C.

[57] ABSTRACT

A semiconductor memory device having a single-cycle internal read/write function provides data relocation at high speed. Data is read from a first or source address location and then transferred directly from the sense amps to write drivers for writing to a destination address without latching in the interim. Accordingly, chip area is reduced by elimination of the I/O latch circuits. Since both the data read and write operations are performed during one cycle time, the cycle time is reduced while the bandwidth is increased. The invention has particular application to frame buffer memories and the like.

9 Claims, 2 Drawing Sheets

SEMICONDUCTOR MEMORY DEVICE WITH SINGLE-CYCLE INTERNAL READ/WRITE FUNCTION

BACKGROUND OF THE INVENTION

1. Field of the Invention

The present invention relates generally to semiconductor memory devices and, in particular, the present invention pertains to methods and circuits in a semiconductor memory device to obtain reduced circuit area, improved speed and simplified operation in connection with relocating data within the memory device.

2. Description of the Prior Art

With the recent appearance of video random access memory (VRAM), many systems makers have used a graphic buffer such as the VRAM to improve the performance of the system. More recently, a window RAM (WRAM), has become available to provide even greater improvements in performance with respect to graphic display applications. The basic function of the WRAM is to relocate data, for example by moving data, "from a DRAM to a latch, and from a latch to a DRAM". Operations of this type support screen display functions such as a block move, scrolling, etc. a high speed.

FIG. 1 is a simplified circuit diagram of a conventional semiconductor memory device having an internal data read/write function. The memory device of FIG. 1 is provided with a memory cell array 10 composed of a plurality of memory cells coupled to a plurality of bit lines, respectively, a plurality of column selection sections 20, coupled between the plurality of bit lines and an input/output data line L, for transmitting data read out from a source location in the memory array onto the input/output data line L in response to a corresponding source column selection signal. The read data applied to the input/output data line L is then transmitted to a destination location in response to a destination column selection signal CSL2 which is generated subsequently to the source column selection signal CSL1. To support these operations, a data amplifying section 40 comprising a sense amp is coupled to the input/output data line L for amplifying the read-out source data, and a latch section 60 is connected to the sense amp for latching the resulting output data. A write drive section 80 drives the latched data from the latch section 60 to the input/output data line L. This circuitry is repeated for each I/O line although only one line is shown for illustration. Further details are omitted as they are well known in the semiconductor memory art.

The operation of the conventional memory device as constructed above will be explained. A bit line of the memory cell array 10 is designated by a corresponding source address for reading out a pixel data (hereinafter referred to as "data"), and a switching transistor in the column selection section 20 is turned on when the corresponding source column selection signal CSL1 is asserted to the column selection section 20. Accordingly, the internal data of the memory cell array is carried on the input/output bus composed of a plurality of bits through the corresponding switching transistors. The data on the input/output bus is amplified by a predetermined amplification factor by the data amplifying section 40, i.e., a sense amplifier, and then latched in the latch section 60.

FIG. 2 illustrates the movement or relocation of a text character on a display screen. Referring to FIG. 2, in order to move the data being displayed on the screen to another position of the screen, an address movement of the data is required in a frame buffer such as VRAM, WRAM, DRAM, etc. In other words, the data are relocated in the frame buffer memory. This can be done internally.

According to prior art, relocation of the data is performed through a latch cell which provides a data moving path such as "from a DRAM to a latch", and "from a latch to a DRAM" in the frame buffer so that the data is read out from the memory and then the read-out data is written in another address of the memory.

When a destination column selection signal CSL2 is provided to the column selection section 20 to store the data in a desired destination address of the memory, a corresponding selection transistor is turned on, and thus the data maintained in the latch section 60 is transferred on the input/output data line L through the write drive section 60, i.e., a write driver WRDRV, causing the data to be stored in the corresponding address of the memory cell array 10 through the switching transistor.

FIG. 3 is a timing diagram further illustrating operation of the conventional memory device. Referring to FIG. 3, the data is read out from the memory cell array 10 during a cycle when the source column selection signal CSL1 and a read drive signal UFBR are activated and a column address strobe signal CASB is activated with a 'low' level. The read-out data is maintained in the latch section 60 via the switching transistor, the input/output data line, and the sense amplifier. Thereafter, the state of "Don't care" is maintained for a predetermined period, and then the data maintained in the latch section 60 is stored in the memory cell array via the write drive section 80, the input/output data line L, and the switching transistor during another cycle when the destination source column selection signal CSL2 and a write drive signal UFBWL are activated and the column address strobe signal CASB is activated with a 'low' level. As a result, the data movement in the memory is performed during two cycles.

One can estimate the speed of data transmission achieved by the above-described data transmission method using two cycles, as follows. Assume, for example, data output is composed of 32 bits, the number of the open state of the simultaneous selection signal CSL is 8 in each of four memory core blocks, and the cycle time is 20 ns. In this illustration, since the data movement through the internal bus in a cycle is 1.6 GBytes/Second (8*32 Bits/20 ns) maximum, and the data moving time in the core cell of 8*32 Bits requires 40 ns (two cycles), the data movement for one second will be 0.8 Giga Bytes.

As described above, the data is carried on the input/output data line in response to the source and destination selection signals CSL1 and CSL2. The numbers of the input/output data lines L, the sense amplifiers S/A of the data amplifying section 40, the input/output drivers IODRV, and the latches of the write drive section 80 equally increase corresponding to the number of selection signals to be gated. In other words, all of these elements are duplicated for each bit in a memory word or row. Consequently, while bandwidth can be increased by increasing word size, the chip size and manufacturing costs while increase as well. Accordingly, the need remains to improve speed of operation in a frame buffer memory or the like without increasing chip area or word size.

SUMMARY OF THE INVENTION

We have determined that substantial improvements in performance of a memory device can be achieved by collapsing the internal read-write (or relocation) operation into a single memory cycle. Thus it is an object of the present invention to solve the problems involved in the prior art, and to provide a semiconductor memory device having a one-cycle-operated internal read/write function capable of reducing the chip size and improving the speed of data relocation. Moreover, circuit size is actually reduced because I/O data latches are obviated by the present invention.

In order to achieve the above object, according to one aspect of the invention, a semiconductor memory device has a one-cycle-operated internal read/write function. In a presently preferred embodiment, the device comprises: a memory cell array composed of a plurality of memory cells coupled to a plurality of bit lines, respectively; a plurality of column selection means, respectively coupled between said plurality of bit lines and an input/output data line, for transmitting data read out from a source to said input/output data line in response to a source column selection signal, and for transmitting said data applied to said input/output data line to a destination of said memory cell array in response to a destination column selection signal generated subsequently to said source column selection signal; data amplifying means, coupled to said input/output data line, for amplifying said read-out source data; and write drive means for outputting said data outputted from said data amplifying means to said input/output data line. Accordingly, a semiconductor memory device according to the present invention provides data relocation at high speed. In operation, data is read from a first or source address location and then transferred directly from the sense amps to write drivers for writing to a destination address without latching in the interim. Accordingly, chip area is reduced by elimination of the I/O latch circuits. Since both the data read and write operations are performed during one cycle time, the cycle time is reduced while the bandwidth is increased. The invention has particular application to frame buffer memories and the like.

BRIEF DESCRIPTION OF THE DRAWINGS

The above objects, other features, and advantages of the present invention will become more apparent by describing the preferred embodiment thereof with reference to the accompanying drawings, in which.

DETAILED DESCRIPTION OF PREFERRED EMBODIMENT

Figure 4:
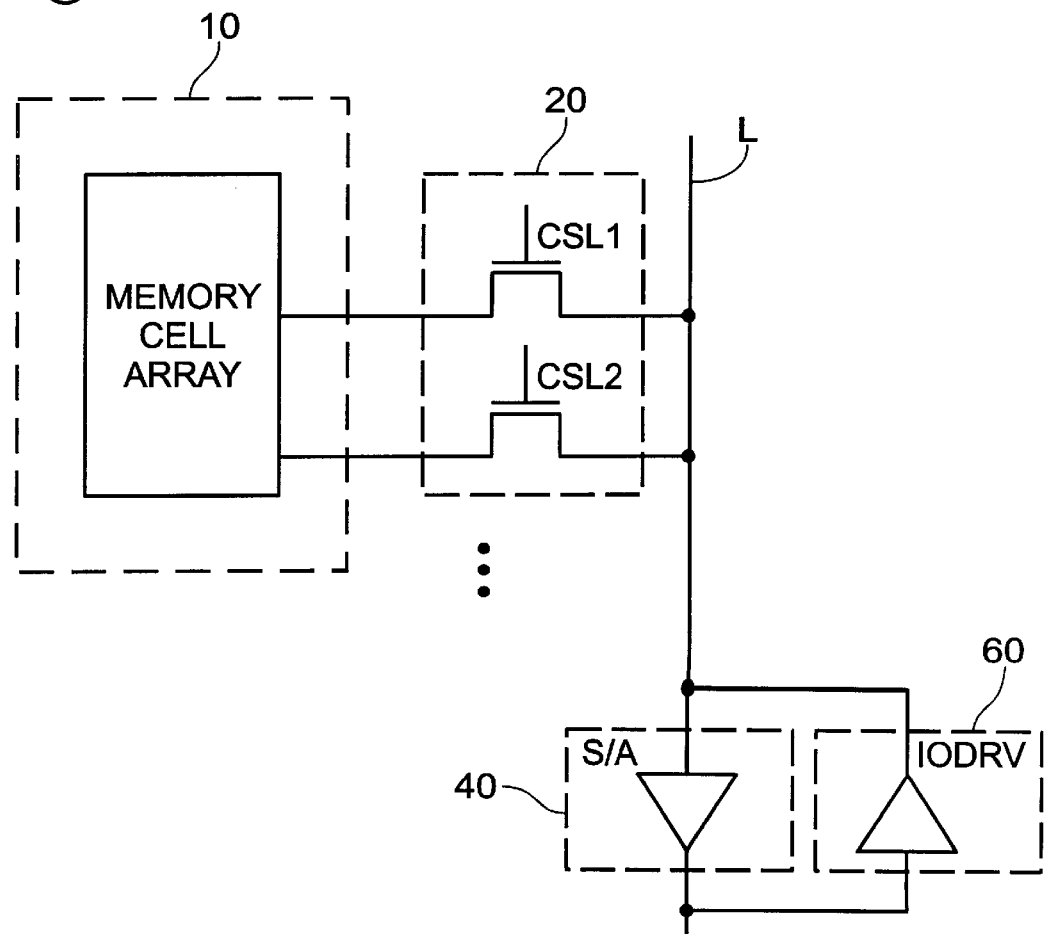
FIG. 4 is a schematic circuit diagram of the semiconductor memory device having an internal data read/write function according to the present invention.

FIG. 4 is a schematic circuit diagram of the semiconductor memory device having a one-cycle-operated internal data read/write function according to the present invention.

Referring to FIG. 4, the memory device according to the present invention includes a memory cell array 10 composed of a plurality of memory cells coupled to a plurality of bit lines, respectively, a plurality of column selection sections 20, coupled between the bit lines and an input/output data line L, respectively, for transmitting data read out from a source to the input/output data line L in response to a source column selection signal CSL1, and for transmitting the data applied to the input/output data line L to a destination of the memory cell array in response to a destination column selection signal CSL2 generated subsequently to the source column selection signal CSL1, a data amplifying section 40, coupled to the input/output data line, for amplifying the read-out source data, and a write drive section 60 for outputting the data from the data amplifying section 40 to the input/output data line L.

The operation of the memory device according to the preferred embodiment of the present invention will now be explained. First, the cell of the memory cell array 10 is designated by the corresponding source address for reading out data, and a switching transistor in the column selection section 20 is turned on by the input of the corresponding source column selection signal CSL1 to the column selection section 20, causing the data of the memory core cell to be carried on the input/output bus L. The data on the input/output bus is inputted to and amplified by the data amplifying section 40 with a predetermined amplification factor. Thereafter, if a destination address is designated to store the amplified data to the destination address of the memory cell array 10, the switching transistor in the destination column selection section 20 is driven by the destination column selection signal CSL2, and thus the data from the data amplifying section 40, without being latched, is immediately stored in the destination address of the memory cell array 10 via the input/output driver IODRV of the write drive section 60.

Figure 1:
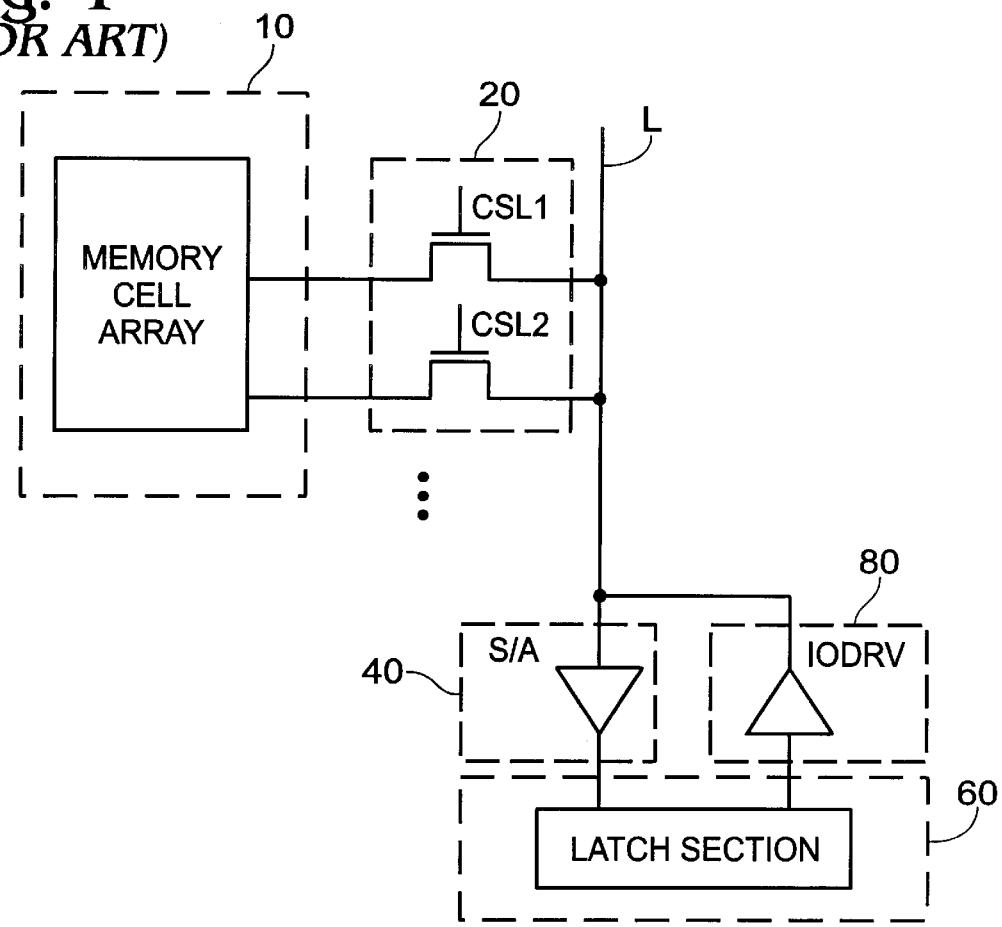
FIG. 1 is a schematic circuit diagram of a conventional semiconductor memory device having an internal data read/write function.
Figure 2:
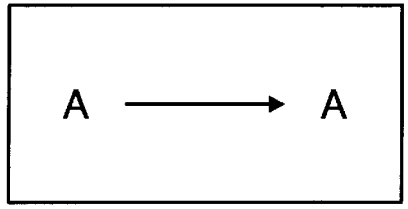
FIG. 2 is a view explaining the movement of a text character displayed on a screen.
Figure 5:
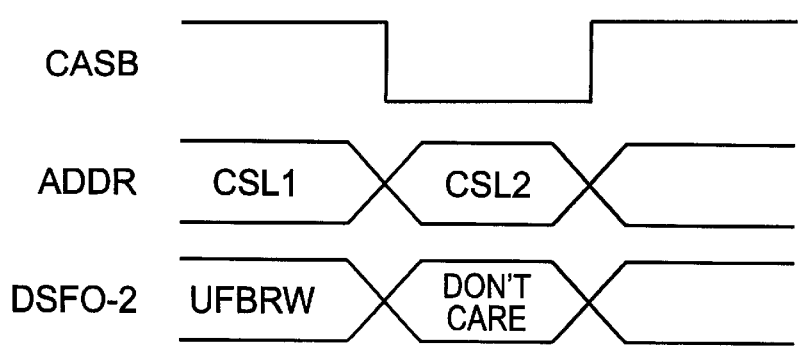
FIG. 5, is a timing diagram explaining the internal data read/write function according to the present invention.
Figure 3:
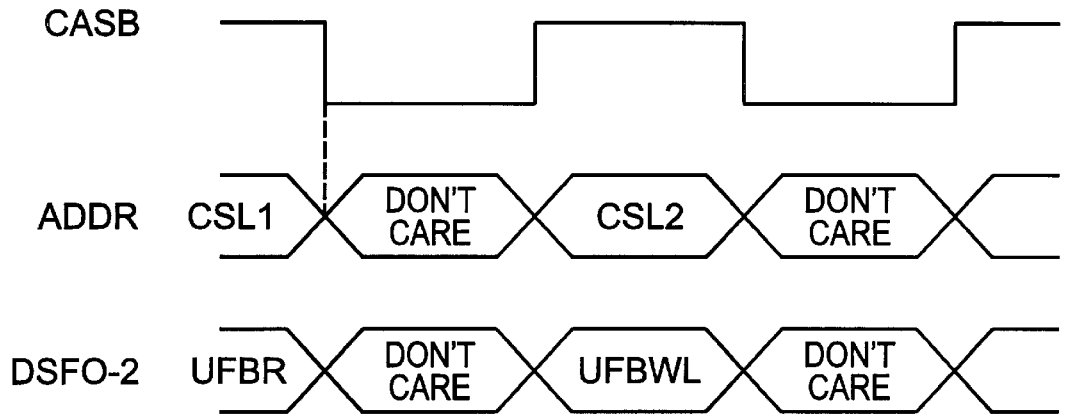
FIG. 3 is a timing diagram explaining the internal data read/write function according to the conventional semiconductor memory device.

FIG. 5 is a timing diagram explaining the internal data read/write function according to the present invention. Referring to FIG. 5, the data is read out from the memory cell array 10 on the front or leading edge of the cycle when the source column selection signal CSL1 and the read/write drive signal UFBRW for controlling the input of the write drive section 60 are activated and the column address strobe signal CASB is activated with a 'low' level. Thereafter, when the destination column selection signal CSL2 is continuously kept active during the active period of the column address strobe signal CASB after the input of the source column selection signal CSL1, the read-out data is stored in the destination address of the memory cell array 10 via the data amplifying section 40 and the write drive section 60. Importantly, the input/output data line L is not precharged by a precharge operation between each active state of the source column selection signal CSL1 and the destination column selection signal CSL2. As a result, according to the above operation, the data read and write operations are performed during one cycle time.

From the foregoing, according to the memory device of the present invention, the data read out from the memory cell array is immediately written in a destination address of the memory without being latched, and thus no latch cell is required, resulting in the decrease of the chip size. Further, since both the read and write operations are performed in one cycle, the cycle time is reduced and the bandwidth is increased, thereby contributing to the improvement of the system performance.

While the present invention has been described and illustrated herein with reference to the preferred embodiment thereof, it will be understood by those skilled in the art that various changes in form and details may be made therein without departing from the spirit and scope of the invention.

What is claimed is:

1. A semiconductor memory device having a one-cycle-operated internal read/write function, comprising:

a memory cell array comprising a plurality of memory cells coupled to a plurality of bit lines, respectively;

a plurality of column selection means, respectively coupled between said plurality of bit lines and an input/output data line, for transmitting data read out from a source location in the memory cell array to said input/output data line in response to a source column selection signal, and for transmitting data applied to said input/output data line to a destination location in the said memory cell array in response to a destination column selection signal generated subsequently to said source column selection signal;

a sense amplifier having an input coupled to said input/output data line, for amplifying said read-out source data; and a write drive amplifier having an input directly connected to the sense amplifier for receiving the amplified read data, and the write drive amplifier having an output coupled back to the input/output data line for driving the read data directly onto the input/output data line as write data.

2. The semiconductor memory device as claimed in claim 1, wherein said input/output data line is not precharged by a precharge operation between each active state of said source column selection signal and said destination column selection signal.

3. The semiconductor memory device as claimed in claim 1, wherein said write drive amplifier receives said amplified read data in response to a leading edge of the destination column selection signal.

4. The semiconductor memory device according to claim 1 wherein said write drive amplifier drives the read data directly onto the input/output data line as write data responsive to the active state of the destination column address selection signal and without requiring a separate write control signal.

5. A single-cycle method of relocating data in a semiconductor memory device having a series of I/O lines, the method comprising the steps of:

providing a source address column selection signal;

receiving a read-write relocation control signal;

responsive to the source address column selection signal and the read-write control signal being simultaneosly asserted, effecting a read operation in response to a first edge of a column address strobe signal so as to read source data from the source address onto the I/O lines;

responsive to a destination address column selection signal, selecting a destination address in the memory; and without precharging the I/O lines, writing the source data back into the array at the destination address.

6. The method according to claim 5 wherein said writing step commences in response to a second edge of the column address strobe signal opposite to the first edge, so that the data is relocated in the memory in a single cycle.

7. The method according to claim 5 wherein said writing step includes transferring the source data from the sense amplifiers directly to the write amplifiers without latching the source data.

8. The method according to claim 5 wherein the write step includes asserting the destination column selection signal sequential to asserting the source column selection signal during one cycle of the column address strobe signal.

9. The method according to claim 5 wherein the read and write step are sequentially performed responsive to a single assertion of the read-write control signal.

* * * * *